United States Patent
Malek et al.

(10) Patent No.: US 9,549,464 B2
(45) Date of Patent: Jan. 17, 2017

(54) MODULES FOR INCREASING USEABLE SPACE ON CIRCUIT BOARDS

(71) Applicant: Apple Inc., Cupertino, CA (US)

(72) Inventors: Shayan Malek, San Jose, CA (US); John B. Ardisana, II, San Francisco, CA (US); Dhaval N. Shah, Fremont, CA (US)

(73) Assignee: Apple Inc., Cupertino, CA (US)

( * ) Notice: Subject to any disclaimer, the term of this patent is extended or adjusted under 35 U.S.C. 154(b) by 13 days.

(21) Appl. No.: 14/015,938

(22) Filed: Aug. 30, 2013

(65) Prior Publication Data

US 2015/0060126 A1    Mar. 5, 2015

(51) Int. Cl.
| | |
|---|---|
| *H05K 1/02* | (2006.01) |
| *H05K 1/14* | (2006.01) |
| *H05K 3/36* | (2006.01) |
| *H05K 1/11* | (2006.01) |

(52) U.S. Cl.
CPC ............ *H05K 1/0284* (2013.01); *H05K 1/141* (2013.01); *H05K 3/36* (2013.01); *H05K 1/115* (2013.01); *H05K 2201/09145* (2013.01); *H05K 2201/10598* (2013.01); *H05K 2203/061* (2013.01)

(58) Field of Classification Search
CPC ........ H05K 1/115; H05K 1/0284; H05K 1/14; H05K 1/141; H05K 1/144; H05K 1/18; H05K 1/181; H05K 2201/049; H05K 2201/1053; H05K 2201/09145; H05K 3/36; H05K 2203/061; H05K 2201/10598

USPC ......... 174/250–268; 361/728, 736, 752, 760, 361/792–795

See application file for complete search history.

(56) References Cited

U.S. PATENT DOCUMENTS

| | | | |
|---|---|---|---|
| 5,615,087 A | 3/1997 | Wieloch | |
| 6,128,201 A * | 10/2000 | Brown et al. | ................ 361/784 |
| 6,185,101 B1 * | 2/2001 | Itabashi et al. | ............... 361/704 |
| 6,395,999 B1 * | 5/2002 | Ploix | ............................. 174/260 |
| 6,560,119 B1 * | 5/2003 | Katsuyama | ............ H05K 7/142 |
| | | | 174/138 D |
| 6,918,297 B2 * | 7/2005 | MacGugan | ........... B81B 7/0074 |
| | | | 257/416 |
| 6,940,266 B2 * | 9/2005 | Roden et al. | ................. 324/126 |
| 7,015,869 B2 * | 3/2006 | Marlow | ................. H01P 5/184 |
| | | | 174/266 |
| 7,465,608 B1 * | 12/2008 | Farrar | .......................... 438/107 |
| 7,508,061 B2 * | 3/2009 | Kang et al. | .................... 257/692 |
| 2006/0077642 A1 * | 4/2006 | Estes | ..................... H05K 7/142 |
| | | | 361/752 |
| 2009/0129041 A1 * | 5/2009 | Cho et al. | ..................... 361/803 |

(Continued)

*Primary Examiner* — Ishwarbhai B Patel
(74) *Attorney, Agent, or Firm* — Downey Brand LLP (57) ABSTRACT

The described embodiments relate generally to electronic devices and to three dimensional modules for increasing useable space on a circuit board associated therewith. In some embodiments, the modules can have a cuboid geometry, and can include a number of surfaces having embedded circuit traces configured to interconnect electronic components arranged on various surfaces of the module. One of the surfaces of module can include at least one communication interface configured to interconnect the circuit traces on the module to associated circuit paths on a circuit board to which the module is coupled. In some embodiments the module can be operative as a standoff between the circuit board and another component of the electronic device.

16 Claims, 10 Drawing Sheets

(56) References Cited

U.S. PATENT DOCUMENTS

| | | | | |
|---|---|---|---|---|
| 2010/0000755 A1* | 1/2010 | Yui | ................... | B29C 45/14639 |
| | | | | 174/50 |
| 2010/0200277 A1 | 8/2010 | Huang et al. | | |
| 2011/0080712 A1* | 4/2011 | Strauss | ................... | H01R 4/56 |
| | | | | 361/752 |
| 2011/0294315 A1* | 12/2011 | Kawabata | ............ | G06K 7/0078 |
| | | | | 439/81 |
| 2013/0168136 A1 | 7/2013 | Inaba et al. | | |

* cited by examiner

MODULES FOR INCREASING USEABLE SPACE ON CIRCUIT BOARDS

FIELD OF THE DESCRIBED EMBODIMENTS

The described embodiments relate generally to electronics and more particularly to modules for increasing useable space on circuit boards.

BACKGROUND

As technology advances, the number of components integrated into electronic devices increases steadily. For example, multiple communication interfaces, chipsets, active and passive components, and other electronic components, are integrated into electronic devices to increase overall functionality or for other reasons. Generally, electronic devices are designed using at least one circuit board, sometimes many, which are substantially planar. The circuit boards typically have up to two useable surfaces for mounting electronic components. It follows that as the number of components increases, the useable space on a fixed-size circuit board decreases.

Conventionally, multiple planar circuit boards may be mounted in relatively close proximity in a stacked formation to increase the available surfaces to mount devices and components. However, it then follows that an overall stack height increases, thereby increasing an end product's depth. Considering the trend in mobile electronic devices, e.g., slimmer, more functional devices being desireable, increases in depth may be a drawback to the device's design and useability.

Therefore, what is desired are methods, systems, and/or apparatuses that increase the useable space on circuit boards while maintaining a relatively fixed depth or height to the circuit board.

SUMMARY

This paper describes various embodiments that relate to electronic devices and their components. According to one embodiment, a module for increasing the useable space on a circuit board is provided. The module may be three dimensional, and may include a first surface, the first surface including a first group of circuit traces embedded therein configured to interconnect a first group of electronic components arranged on the first surface, a second surface, the second surface including a second group of circuit traces embedded therein configured to interconnect a second group of electronic components arranged on the second surface, and a third surface connected to the first surface and the second surface, the third surface including at least one communication interface configured to interconnect the first and second groups of circuit traces to associated circuit paths on the circuit board.

According to another embodiment, a cuboid module for mounting electronic components to a printed circuit board is disclosed. The cuboid module includes a lateral surface configured for mounting at a first non-zero angel with respect to the printed circuit board. The lateral surface includes a number of circuit traces and a number of edge connectors. The edge connectors are configured to electrically couple at least one circuit of the circuit traces to a corresponding electrical trace disposed on the printed circuit board.

According to yet another embodiment, a substantially cuboid module for increasing useable space on a circuit board is disclosed. The substantially cuboid module may include a number of side surfaces arranged about a central core. The side surfaces include a number of circuit traces embedded therein configured to interconnect a number of electronic components arranged thereon. The substantially cuboid module may further include a base surface connected to the side surfaces. The base surface includes at least one communication interface configured to interconnect the circuit traces to associated circuit paths on the circuit board.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. These drawings are not necessarily drawn to scale. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

As described herein, modules are provided which increase the useable space on circuit boards of electronic devices. The modules may generally be cuboid structures having two or more surfaces configured to receive electronic components and route communication between the same. By describing the module as a cuboid it is generally meant that the geometry of the module includes six intersecting faces defining a three dimensional volume. Although a cuboid structure is used to illustrate various aspects of these modules, it should be understood that any three-dimensional structure increasing useable space on a circuit board can be used. For example, in some embodiments a corner of a cuboid structure might extend past a constraint such as a housing sidewall. Given the existence of such a constraint a corner of the module can be rounded or in some cases an additional wall can be added to allow the module to conform to the amount of space available. The two or more surfaces may include a plurality of circuit traces for routing communication, providing power and/or ground potential, and for implementing communication between the received electronic components and the circuit board. The circuit traces can be configured to electrically couple components disposed on any surface of the module in addition to routing communications to the printed circuit board. In some embodiments the module can include edge connectors for routing circuit traces between various surfaces of the module. For example, a junction between two surfaces can edge connectors for extending a circuit trace across the junction.

According to one embodiment, the two or more surfaces are formed of stacked layers of printed circuit board material. The two or more surfaces may be in communication with one another through internal vias arranged within the cuboid. Alternatively, the two or more surfaces may be in communication through the circuit board, or may be electrically isolated depending on any desired implementation. According to an additional embodiment, the cuboid may include an aperture arranged to receive a fastener such that the cuboid doubly functions to increase useable space while also replacing a traditional standoff. The cuboid may be used to separate "noisy" or otherwise problematic components from other components on a circuit board. Additionally, the cuboid may be used to separate an antenna device from the circuit board to increase range of operation. Also, the cuboid may be used to separate and/or alter sound emitted from electronic components, for example, singing capacitors. These and other features are described below with reference to the many drawings.

Figure 1:
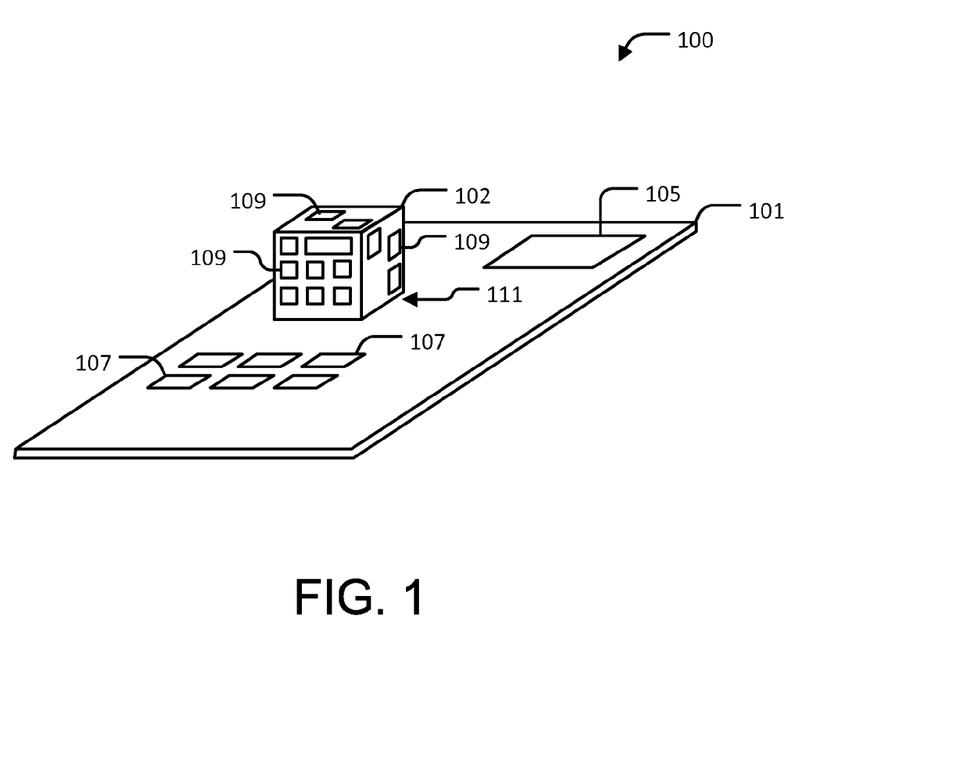
FIG. 1 shows a perspective view a circuit board having a module installed, in accordance with an exemplary embodiment of the invention.

FIG. 1 shows a perspective view a circuit board 100 having a module 102 installed, in accordance with an exemplary embodiment of the invention. The circuit board 100 may include a substrate 101. The substrate 101 may be a printed circuit board substrate formed of any technically feasible material. According to one embodiment, the substrate 101 is formed of a glass-reinforced epoxy laminate material, such as FR-4. The substrate 101 may include a plurality of circuit traces embedded therein for forming a circuit or a plurality of circuits of a personal electronic device, such as a cell phone, media player, personal digital assistant, tablet computer, or other device. The plurality of circuit traces may include a plurality of surface pads configured to receive a plurality of electronic components. The electronic components may include one or more processors 105, components 107, or other devices.

As further illustrated in FIG. 1, the circuit board 100 further includes module 102 installed on the substrate 101. Generally, the module 102 is a cuboid structure having a plurality of surfaces to which components 109 are mounted to. Each surface may include a plurality of circuit traces embedded therein and configured to compliment and/or complete the circuit traces of the substrate 101 such that the components 109 are in communication with one or more components arranged on the substrate 101. For example, the components 109 may include one or more capacitors, chipsets, resistors, communication interfaces, or other suitable components for use with the substrate 101. Upon installation of the module 102, these components 109 are integrated therewith such that they function as if traditionally mounted on the substrate 101. The integration may be facilitated through mounting arrangement 111. The mounting arrangement 111 may include communication interfaces such as exposed pads, a ball-grid-array (BGA) or any other suitable interfaces, and may further include underfilling in some embodiments. The integration between the module 102 and the substrate 101 is implemented through the circuit traces embedded within the many surfaces of the module 102, and is described more fully below with reference to FIGS. 2-4.

Figure 2:
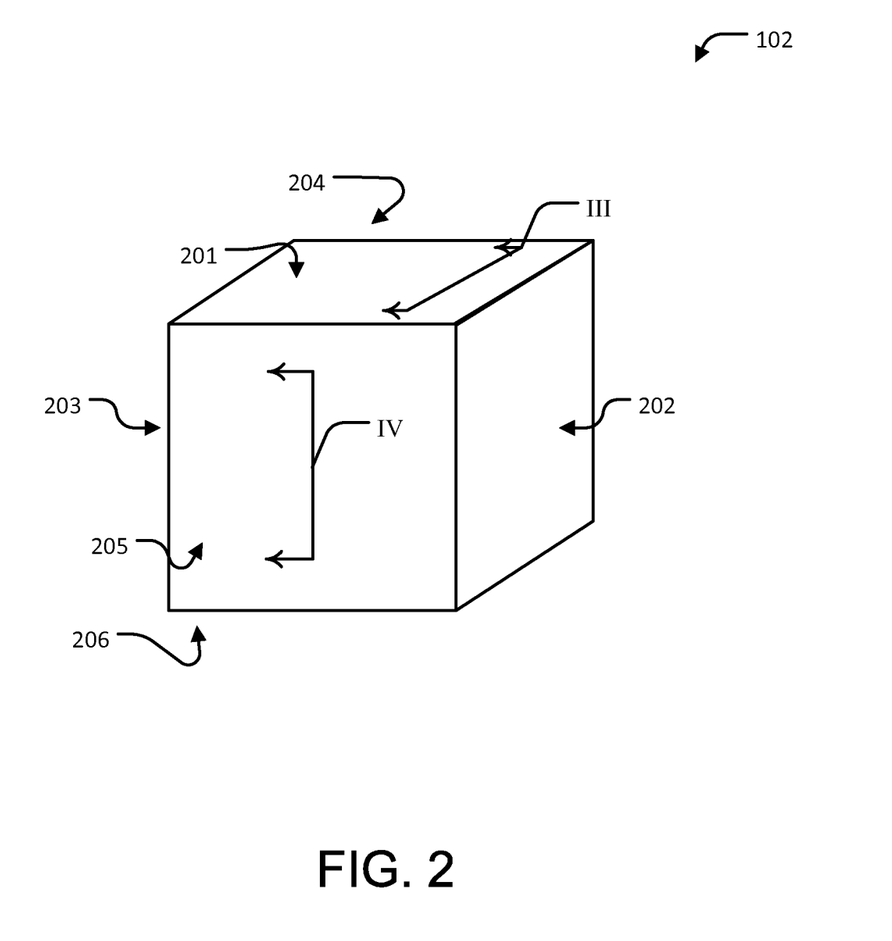
FIG. 2 shows a schematic view of the module of FIG. 1.

FIG. 2 shows a schematic view of the module 102. As shown, the module 102 has a generally cuboid structure. However, it is understood that the module may include any three-dimensional structure having one or more substantially planar surfaces for mounting electronic components. Furthermore, if the mounted components are relatively narrow or include communication pads (e.g., for soldering) in a relatively narrow formation, the one or more surfaces may also be curved. As shown, the surfaces include at least six surfaces according to one embodiment. The six surfaces include an upper surface 201, four side surfaces 202, 203, 204, 205 arranged adjacent to the upper surface 201, and a lower surface 206 arranged adjacent to the four side surfaces 202, 203, 204, 205. It is understood that although the terms upper and lower have been used, this terminology is merely to reference the particular arrangement illustrated, and is non-limiting. For example, each surface may be equally termed a side surface or simply a surface, without departing from this disclosure. According to one embodiment, the lower surface 206 is a base surface for mounting of the module 102 onto the substrate 101. Furthermore, according to one embodiment, the upper surface 201 is substantially parallel to the surface 206 and substantially orthogonal to the surfaces 202, 203, 204, 205.

Figure 3:
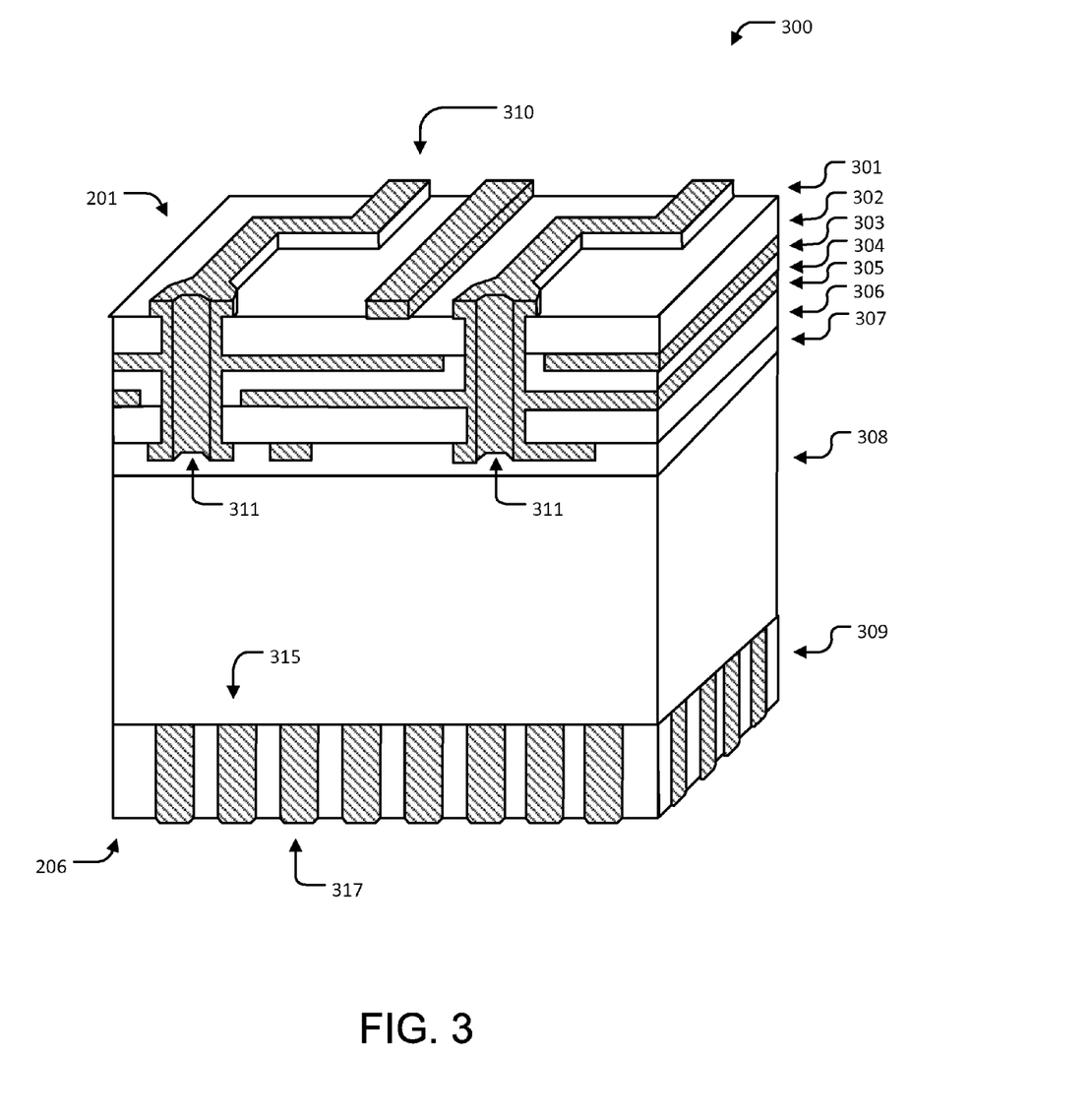
FIG. 3 shows a cross sectional view of two surfaces of the module of FIG. 2.
Figure 4:
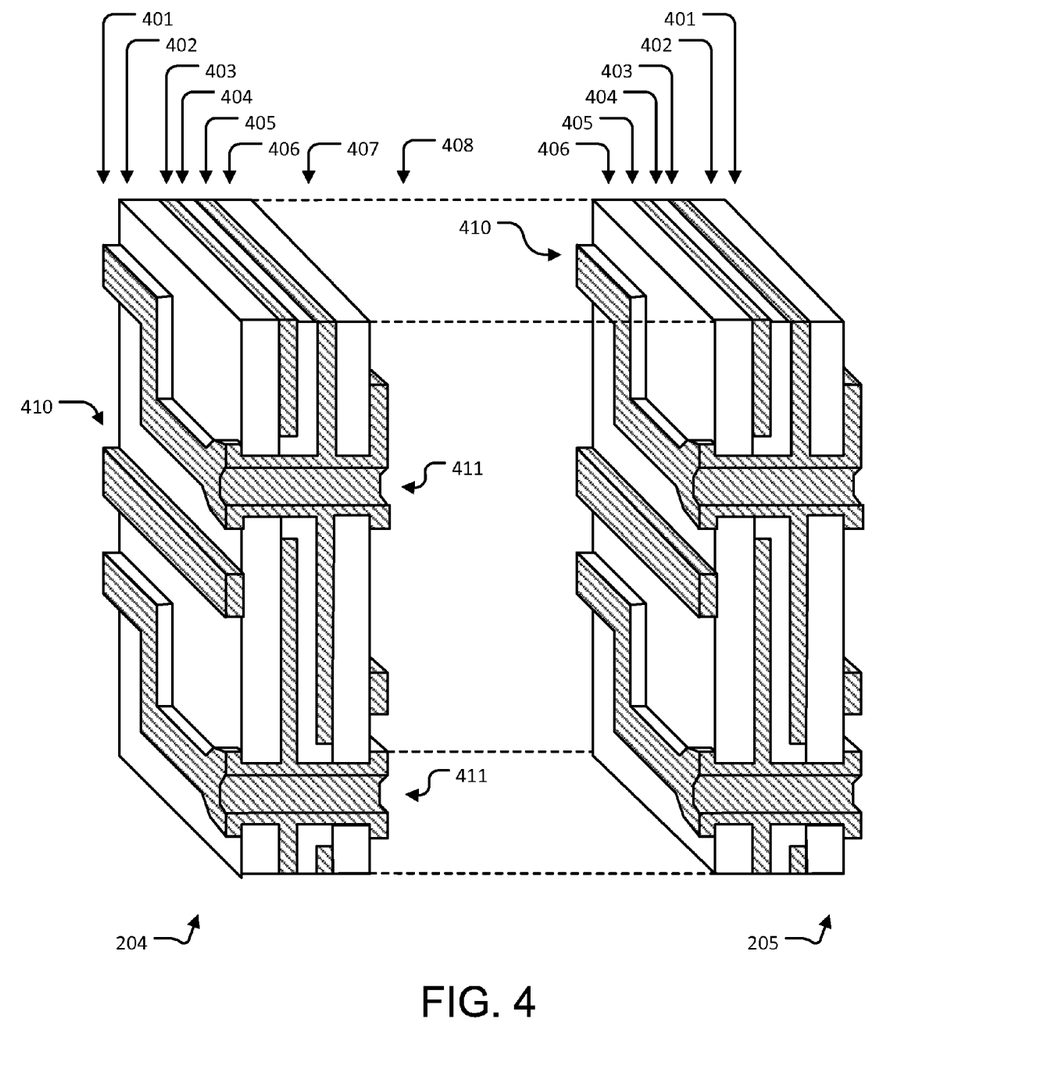
FIG. 4 shows a cross sectional view of two surfaces of the module of FIG. 2.

As described above, each surface 201, 202, 203, 204, 205, 206 may include one or more circuit traces embedded therein for integration with a substrate of a circuit board. Turning to FIGS. 3 and 4, a more detailed discussion of the arrangement of the surfaces and the implementable circuit traces is provided.

FIG. 3 shows a cross sectional view 300 of two surfaces (e.g., 201, 206) of the module 102 of FIG. 2. As shown, the surface 201 includes a plurality of circuit traces 310 and vias 311 embedded therein. The circuit traces 310 may terminate in one or more locations at exposed pads for mounting the components 109, for example, through solder. The vias 311 may facilitate communication between multiple layers of the surface 201. For example, the surface 201 includes a plurality of layers 301, 302, 303, 304, 305, 306, 307 adjacent a core 308 and layer 309 of surface 206. The layer 301 may be an upper layer having circuit traces 310 routed therethrough and may include a cover layer (not illustrated for clarity). The layer 302 may be adjacent the layer 301, and may include core material, such as, for example, glass-reinforced epoxy material. The layer 303 may be adjacent the layer 302, and may include additional circuit traces routed therethrough. The layer 304 may be adjacent the layer 303 and may include additional circuit traces routed therethrough as well as having pre-preg core material such as glass-reinforced epoxy material embedded therein. The layer 305 may be adjacent the layer 304 and may include additional circuit traces routed therethrough. The layer 306 may be adjacent the layer 305 and may include core material, such as, for example, glass-reinforced epoxy material. The layer 307 may include additional circuit traces routed therethrough. The core 308 may also include pre-preg core material such as glass-reinforced epoxy material. The layer 309 may include a communication interface, for example, ball-grid array interface 317 facilitated through circuit traces 315 which may be in communication with one or more of the layers 301, 302, 303, 304, 305, 306, 307 and thereby also with the components 109. It is noted that more or less layers may be assembled into the module 102 without departing from the scope of this disclosure. Furthermore, alternate materials, including core materials or circuit trace materials may be implemented without departing from this disclosure. Moreover, any suitable circuit may be implemented through surfaces 201, 206 and the associated layers, using different layering structures and circuit traces than those particularly illustrated.

As described above, the surface 206 may include a communication interface 317 for communication with the substrate 101. However, side surfaces, such as surface 202, 203, 204, 205 may be arranged substantially similar to surface 201, for example, for providing vertical surfaces by which to integrate additional components 109.

FIG. 4 shows a cross sectional view of two surfaces (e.g., 204, 205 or 202, 203) of the module of FIG. 2. As shown, the surfaces 204, 205 include a plurality of circuit traces 410 and vias 411 embedded therein. The circuit traces 410 may terminate in one or more locations at exposed pads for mounting the components 109, for example, through solder. The vias 411 may facilitate communication between multiple layers of the surfaces 204, 205. For example, the surfaces 204, 205 include a plurality of layers 401, 402, 403, 404, 405, 406, 407 adjacent a core 408. The layer 401 may be an upper layer having circuit traces 410 routed therethrough and may include a cover layer (not illustrated for clarity). The layer 402 may be adjacent the layer 401, and may include core material, such as, for example, glass-reinforced epoxy material. The layer 403 may be adjacent the layer 402, and may include additional circuit traces routed therethrough. The layer 404 may be adjacent the layer 403 and may include additional circuit traces routed therethrough as well as having pre-preg core material such as glass-reinforced epoxy material embedded therein. The layer 405 may be adjacent the layer 404 and may include additional circuit traces routed therethrough. The layer 406 may be adjacent the layer 405 and may include core material, such as, for example, glass-reinforced epoxy material. The layer 407 may include additional circuit traces routed therethrough. The core 408 may also include pre-preg core material such as glass-reinforced epoxy material. It is noted that more or less layers may be assembled into the module 102 without departing from the scope of this disclosure. Furthermore, alternate materials, including core materials or circuit trace materials may be implemented without departing from this disclosure. Moreover, any suitable circuit may be implemented through surfaces 202, 203, 204, 205 and the associated layers, using different layering structures and circuit traces than those particularly illustrated.

As described above, modules (e.g., 102) are provided which increase the useable space on circuit boards 101 of electronic devices. The module 102 may generally be cuboid structures having two or more surfaces (201, 202, 203, 204, 205, 206) configured to receive electronic components 109 and route communication between the same. The surfaces may include a plurality of circuit traces 310, 410 for routing communication, providing power and/or ground potential, and for implementing communication between the received electronic components 109 and the circuit board 101. According to one embodiment, the two or more surfaces are formed of stacked layers 301-309 and 401-408 of printed circuit board material. The two or more surfaces may be in communication with one another through internal vias 311, 411 arranged in the cuboid. Alternatively, the two or more surfaces may be in communication through the circuit board, or may be electrically isolated depending on any desired implementation.

Although described above as functioning to increase useable space by having multiple surfaces for mounting components 109, the same may be varied and extended to further increase the benefits of embodiments of the invention. For example, modules described below may also function to replace existing non-electrical components such as traditional standoffs while reclaiming lost area through the use of the side surfaces described above.

Figure 5:
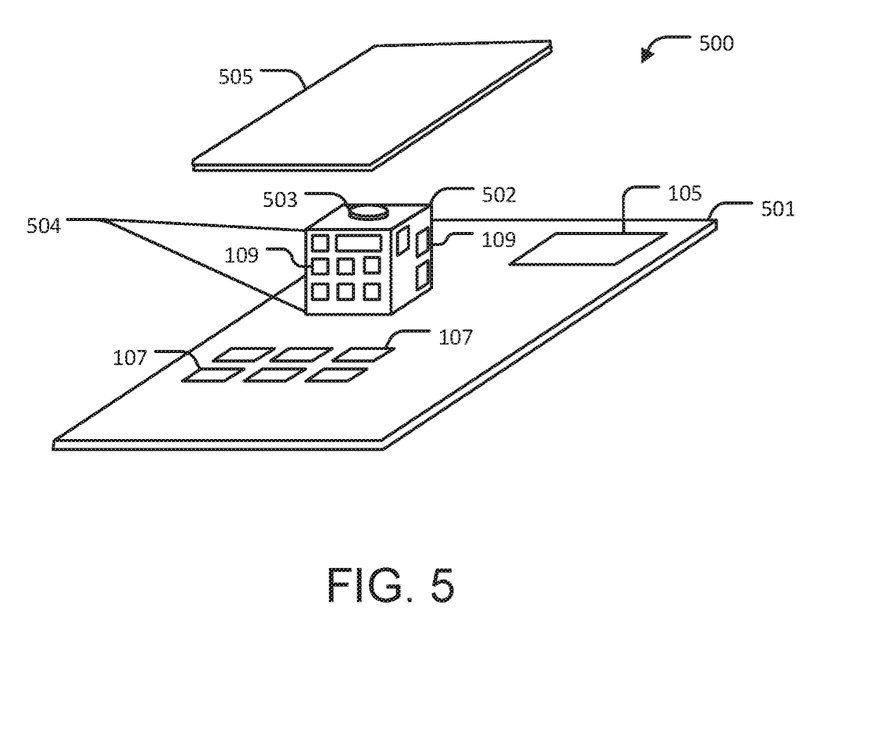
FIG. 5 shows a perspective view of a circuit board having a module installed, in accordance with an exemplary embodiment of the invention.

For example, FIG. 5 shows a perspective view of a circuit board 500 having a module 502 installed, in accordance with an exemplary embodiment of the invention. The circuit board 500 may include a substrate 501. The substrate 501 may be a printed circuit board substrate formed of any technically feasible material. According to one embodiment, the substrate 501 is formed of a glass-reinforced epoxy laminate material, such as FR-4. The substrate 501 may include a plurality of circuit traces embedded therein for forming a circuit or a plurality of circuits of a personal electronic device, such as a cell phone, media player, personal digital assistant, tablet computer, or other device. The plurality of circuit traces may include a plurality of surface pads configured to receive a plurality of electronic components. The electronic components may include one or more processors 105, components 107, or other devices.

As further illustrated in FIG. 5, the circuit board 500 further includes module 502 installed on the substrate 501. Generally, the module 502 is a cuboid structure having a plurality of side surfaces to which components 109 are mounted to. Each side surface may include a plurality of circuit traces embedded therein and configured to compliment and/or complete the circuit traces of the substrate 501 such that the components 109 are in communication with one or more components arranged on the substrate 501. For example, the components 109 may include one or more capacitors, chipsets, resistors, communication interfaces, or other suitable components for use with the substrate 501. As further illustrated, the module 502 may include an aperture through which fastener 503 may be received. In some embodiments, the aperture of module 502 can be configured to position fastener 503 within module 502 such that fastener 503 is electrically coupled to circuit traces embedded within module 502. In this way various circuits within module 502 can provide grounding pathways or communication between any component to which fastener 503 is in electrical communication. Due to the depth 504 of the module 502, the module 502 may further function as a standoff for mounting of the substrate 501 to a mounting member 505 after installation of the module. Upon installation of the module 502, these components 109 are integrated therewith such that they function as if traditionally mounted on the substrate 101. The integration may be facilitated through a mounting arrangement similar to that described above, for example, having a communication interface and/or underfilling or mechanical support. The integration between the module 502 and the substrate 501 is implemented through the circuit traces embedded within the side surfaces of the module 502, and is described more fully below with reference to FIGS. 6-8.

Figure 6:
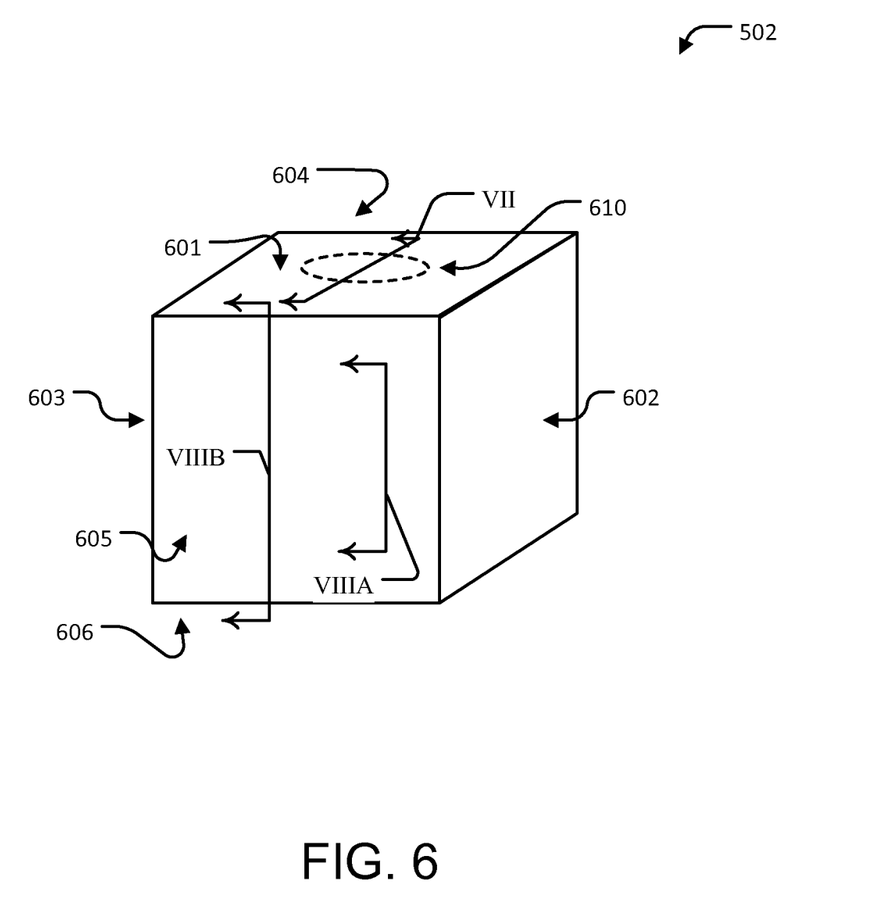
FIG. 6 shows a schematic view of the module of FIG. 5.

FIG. 6 shows a schematic view of the module 502. As shown, the module 502 has a generally cuboid structure. However, it is understood that the module may include any three-dimensional structure having one or more substantially planar surfaces for mounting electronic components. Furthermore, if the mounted components are relatively narrow or include communication pads (e.g., for soldering) in a relatively narrow formation, the one or more surfaces may also be curved. As shown, the surfaces include at least six surfaces according to one embodiment. The six surfaces include an upper surface 601, four side surfaces 602, 603, 604, 605 arranged adjacent to the upper surface 601, and a lower surface 606 arranged adjacent to the four side surfaces 602, 603, 604, 605. As shown, the upper surface 601 may include feature 610, which, according to at least one embodiment, is an aperture for receiving and supporting a fastener. It is understood that although the terms upper and lower have been used, this terminology is merely to reference the particular arrangement illustrated, and is non-limiting. For example, each surface may be equally termed a side surface or simply a surface, without departing from this disclosure.

Figure 7:
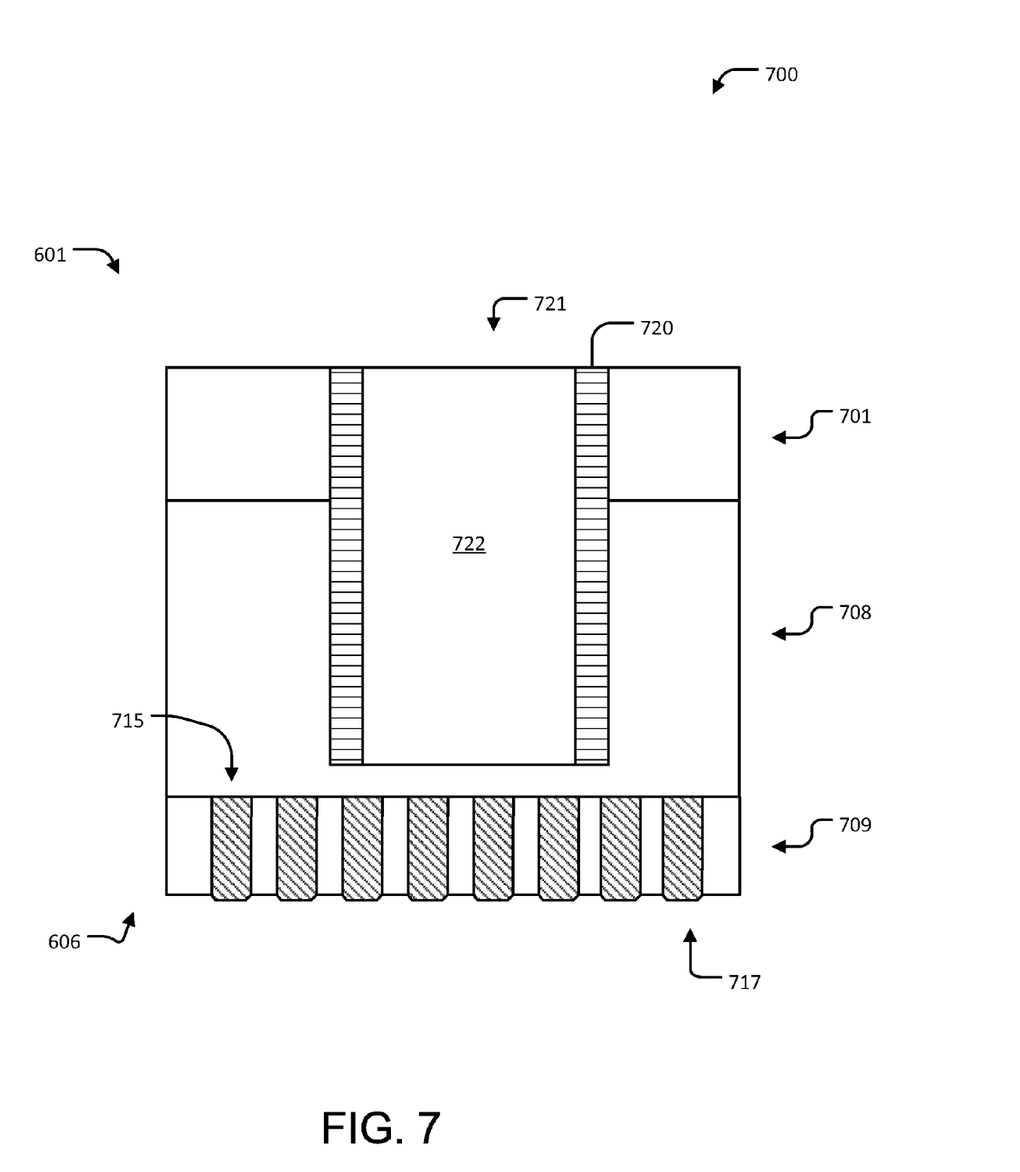
FIG. 7 shows a cross sectional view of two surfaces of the module of FIG. 6.
Figure 8A:
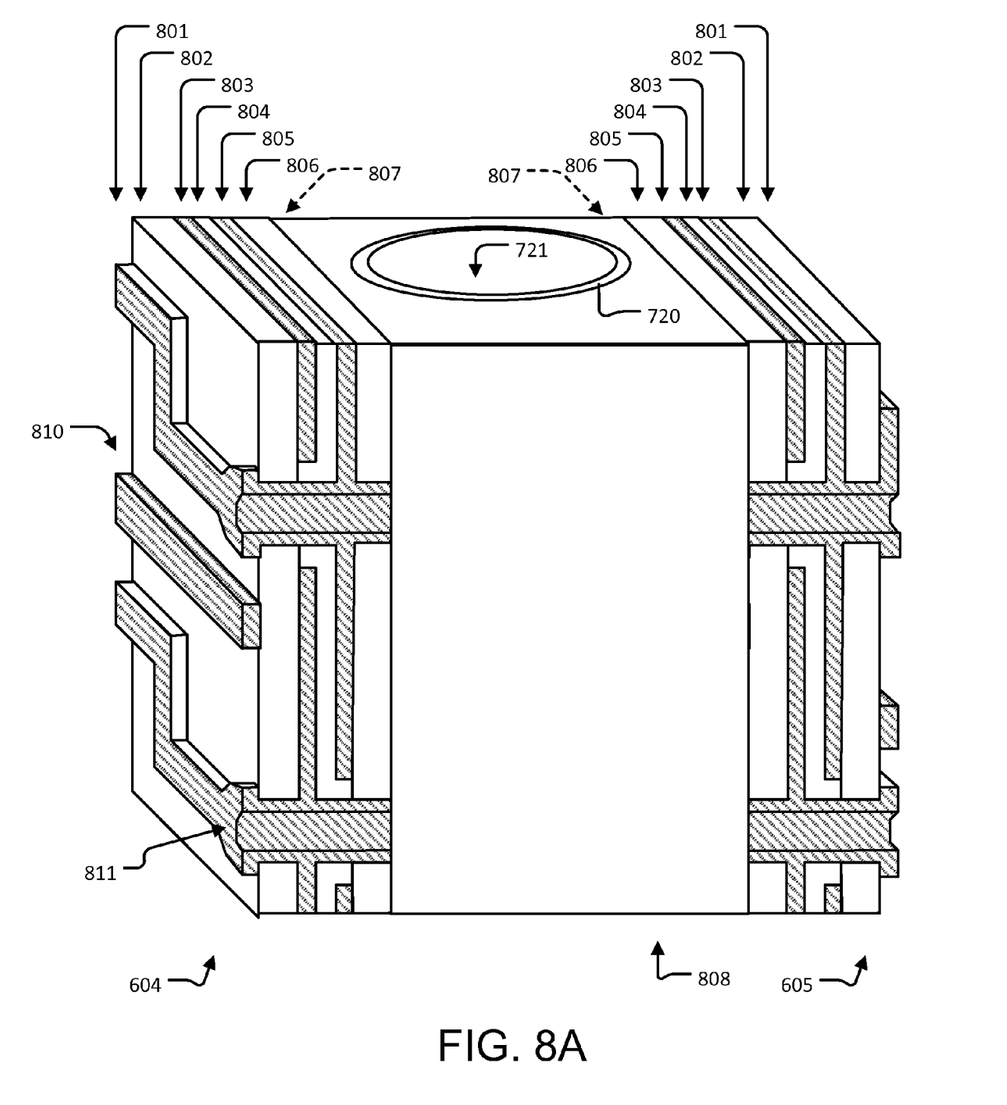
FIGS. 8A and 8B show a cross sectional view of two surfaces of the module of FIG. 6.
Figure 8B:
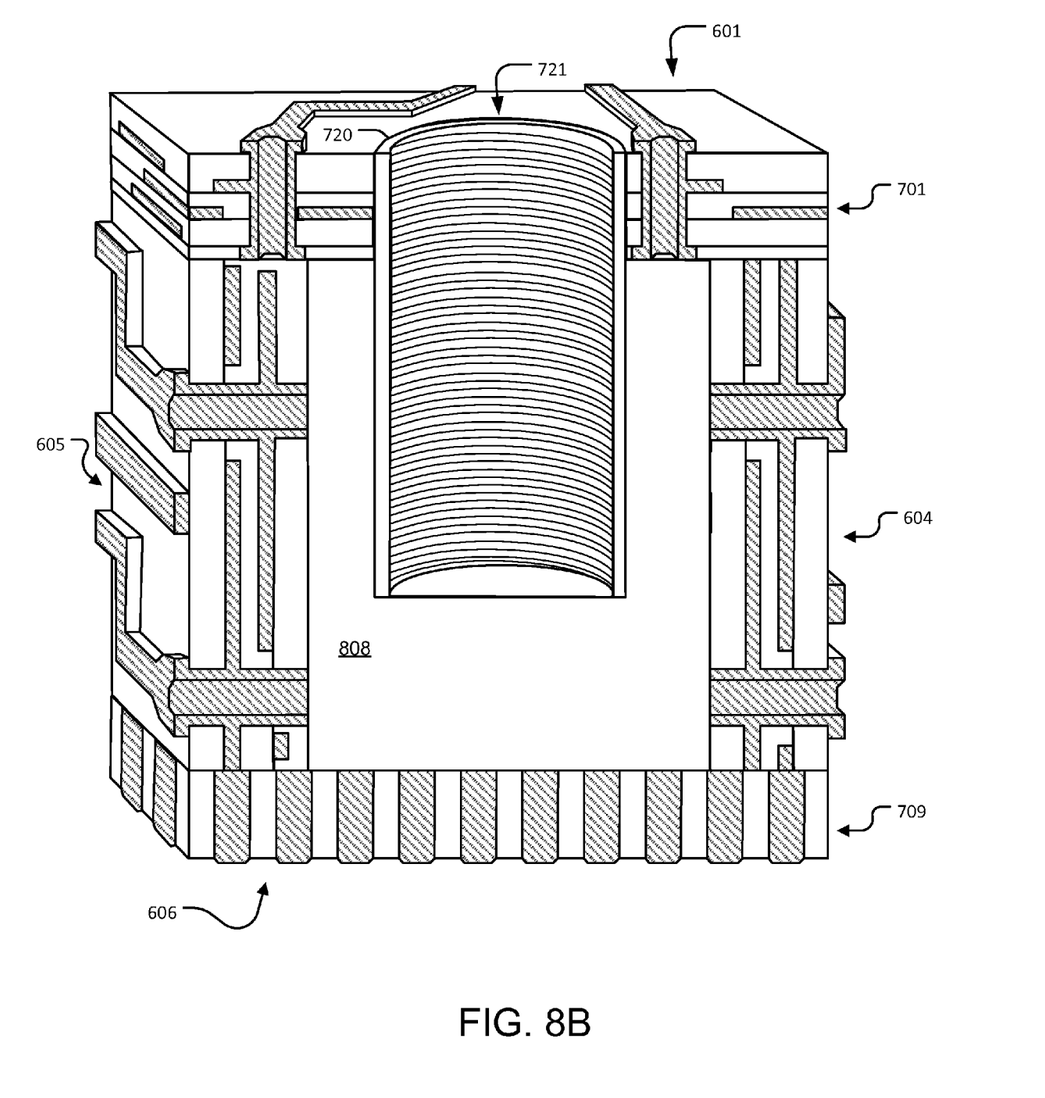

As described above, each surface 602, 603, 604, 605, 606 may include one or more circuit traces embedded therein for integration with a substrate of a circuit board. Furthermore, surface 601 (and/or 606 in some embodiments) may include an aperture for receiving and supporting a fastener. Turning to FIGS. 7 and 8, a more detailed discussion of the arrangement of the surfaces and the implementable circuit traces and fastener are provided.

FIG. 7 shows a cross sectional view 700 of two surfaces (e.g., 601, 606) of the module 502 of FIG. 5. As shown, the surface 601 includes an upper layer 701 adjacent a core 708. Aperture 721 may be formed through layer 701 and through at least a portion of the core 708. The central axis of the aperture (and corresponding fastener) may be substantially parallel to the side surfaces 602, 603, 604, 605. According to at least one embodiment, the aperture 721 is formed only in layers 701 and core 708. According to other embodiments, the aperture 721 is formed through the entire module 502 such that it is exposed through apertures on each of surfaces 601 and 606 for passing a fastener completely through the module 502 and into a portion of the substrate 501. These apertures may be in substantial alignment or registration. Furthermore, a threaded insert 720 having a central cavity 722 for receiving the fastener and a plurality of retention features (e.g., threads) for supporting the fastener 503 may be press-fitted into the aperture 721. For example, the threaded insert 720 may be a helical insert having metallic threads. The threaded insert may also be a nut or complementary fastener in some embodiments. Still further, the threaded insert 720 may lack threads in some embodiments.

Turning back to FIG. 7, the surface 606 includes a layer 709 adjacent the core 708. The core 308 may include pre-preg core material such as glass-reinforced epoxy material. The layer 709 may include a communication interface, for example, ball-grid array interface 717 facilitated through circuit traces 715 which may be in communication with one or more layers of the side surface 602, 603, 604, 605, and thereby also with the components 109. It is noted that more or less layers may be assembled into the module 502 without departing from the scope of this disclosure. Furthermore, alternate materials, including core materials, insert materials, or circuit trace materials may be implemented without departing from this disclosure. Moreover, any suitable aperture may be included through one or both of surfaces 601, 606 for receiving and supporting the fastener 503.

As described above, the surface 606 may include a communication interface 717 for communication with the substrate 501 and one or both of surfaces 601, 606 may include an aperture for receiving and supporting a fastener. Thus, two surfaces are provided which may serve to replace a traditional standoff. Furthermore, side surfaces, such as surface 602, 603, 604, 605 may be arranged substantially similar to surfaces 202, 203, 204, 205 described above, for example, for providing vertical surfaces by which to integrate additional components 109. This is described more fully below.

FIG. 8A shows a cross sectional view of two surfaces (e.g., 604, 605 or 602, 603) of the module of FIG. 5. As shown, the surfaces 604, 605 include a plurality of circuit traces 810 and vias 811 embedded therein. The circuit traces 810 may terminate in one or more locations at exposed pads for mounting the components 109, for example, through solder. The vias 811 may facilitate communication between multiple layers of the surfaces 604, 605. For example, the surfaces 604, 605 include a plurality of layers 801, 802, 803, 804, 805, 806, 807 adjacent a core 808. The layer 801 may be an upper layer having circuit traces 810 routed therethrough and may include a cover layer (not illustrated for clarity). The layer 802 may be adjacent the layer 801, and may include core material, such as, for example, glass-reinforced epoxy material. The layer 803 may be adjacent the layer 802, and may include additional circuit traces routed therethrough. The layer 804 may be adjacent the layer 803 and may include additional circuit traces routed therethrough as well as having pre-preg core material such as glass-reinforced epoxy material embedded therein. The layer 805 may be adjacent the layer 804 and may include additional circuit traces routed therethrough. The layer 806 may be adjacent the layer 805 and may include core material, such as, for example, glass-reinforced epoxy material. The layer 807 may include additional circuit traces routed therethrough (not illustrated for clarity of fastener). The core 808 may also include pre-preg core material such as glass-reinforced epoxy material, and may include the aperture 721 for receiving fastener 503 formed therethrough. It is noted that more or less layers may be assembled into the module 502 without departing from the scope of this disclosure. Furthermore, alternate materials, including core materials, insert material, or circuit trace materials may be implemented without departing from this disclosure. Moreover, any suitable circuit may be implemented through surfaces 602, 603, 604, 605 and the associated layers, using different layering structures and circuit traces than those particularly illustrated.

As described above, modules (e.g., 502) are provided which increase the useable space on circuit boards 501 of electronic devices. The module 502 may generally be cuboid structures having two or more surfaces (602, 603, 604, 605, 606) configured to receive electronic components 109 and route communication between the same. The surfaces may include a plurality of circuit traces 810 for routing communication, providing power and/or ground potential, and for implementing communication between the received electronic components 109 and the circuit board 501. According to one embodiment, the two or more surfaces are formed of stacked layers 801-808 and 701-709 of printed circuit board material. The two or more surfaces may be in communication with one another through internal vias 811 arranged in the cuboid. Alternatively, the two or more surfaces may be in communication through the circuit board, or may be electrically isolated depending on any desired implementation. Furthermore, at least one surface of the module 502 is arranged to receive a fastener 503 such that the module 502 both replaces a traditional standoff while also increasing useable space on the circuit board 501.

FIG. 8B shows an overall cross-sectional view of the module of FIG. 5 in accordance with section line VIIIB. In particular it shows one way in which surfaces 601, 604, 605 and 606 interact to form the module. For example, in some cases edges of the material forming surface 605 can be electrically coupled with electrically conductive pathways making up surfaces 601 and/or 606. It should be noted that while surface 601 is depicted as extending all the way across the top of the module, in some embodiments, surface 601 can also include edges of the material forming surfaces 604 and 605. Furthermore, a depth that insert 720 extends into core 808 can depend upon how strong a coupling between fastener 503 and insert 720 is desired to be.

Hereinafter, methods of increasing useable space on circuit boards are described in detail with reference to FIG. 9.

Figure 9:
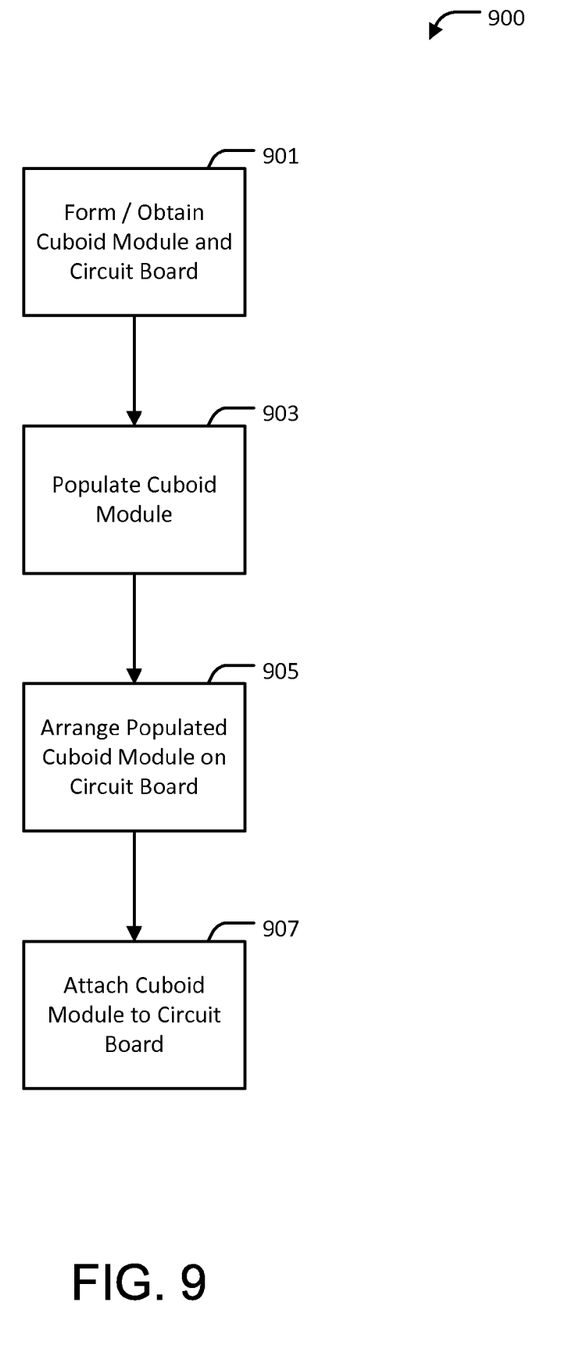
FIG. 9 shows a flowchart of a method of increasing useable space on a circuit board, in accordance with an exemplary embodiment of the invention.

FIG. 9 shows a flowchart of a method 900 of increasing useable space on a circuit board, in accordance with an exemplary embodiment of the invention. The method includes forming and/or obtaining a module and a circuit board at block 901. The forming may include attaching a plurality of layers comprising circuit traces, communication vias, glass-reinforced epoxy material, printed circuit board material, or other suitable layers to form a substantially cuboid structure having at least some of the features described above with reference to module 502.

The method 900 further includes populating the cuboid module with a plurality of electronic components at block 903. The populating may include, according to some embodiments, arranging electronic components on a first surface of the module, and processing the first surface to attach the electronic components to the first surface. The arranging may include automated placement similar to populating a single surface of a planar circuit board. The processing may include reflow processing, wave soldering, or any suitable processing. Thereafter, the remaining surfaces may be populated in succession. Alternatively, the populating may include populating a plurality of surfaces of the module at substantially the same time, for example, using a process which allows attachment of the components to one or more vertical surfaces of the module.

Subsequently, the method 900 includes arranging the populated cuboid module onto the circuit board at block 905. The arranging may include aligning a communication interface of a surface of the module (e.g., a ball-grid array or other interface) with a complementary interface on the circuit board. The arranging may also include application of conductive adhesives or any other suitable arrangement technique.

Upon arrangement, the method 900 further includes attaching the cuboid module to the circuit board at block 907. The attaching may include processing of the module and the circuit board to adhere the module to the surface board. The processing may include a process of a lower temperature than the process of block 903 to avoid disturbance of the populated components. The processing may also include application of underfill to secure the cuboid module to the circuit board.

The various process blocks depicted above may occur in any desireable or feasible order. Furthermore, the details of each process block may be altered according to any applicable implementation of exemplary embodiments of the invention. Moreover, additional process blocks may also be applicable, for example, including formation of a recess or aperture 721 for receiving a fastener 503 and insert 720 in some embodiments.

The various aspects, embodiments, implementations or features of the described embodiments can be used separately or in any combination.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A three dimensional module configured to mount electronic components to a circuit board, the module comprising:
   a first printed circuit board (PCB) comprising circuit traces;
   a second PCB comprising circuit traces and connected to the first PCB at a first angle;
   a third PCB comprising circuit traces and connected to the first PCB at a second angle and connected to the second PCB at a third angle, the third PCB comprising a communication interface configured to interconnect circuit traces of the first and second PCBs to associated circuit paths on the circuit board;
   a fourth PCB opposite the third PCB, the fourth PCB defining an aperture disposed therethrough; and
   a core surrounded by the first, second, third, and fourth PCBs, the core defining a channel having a metal insert positioned therein, wherein the metal insert is accessible through the aperture and includes threading for receiving and securing a threaded end of a fastener.

2. The module of claim 1, wherein the first angle is about ninety degrees.

3. The module of claim 1, wherein the first PCB comprises layers arranged in a stack formation, the layers comprising:
   a first layer comprising at least a portion of the circuit traces;
   a second layer arranged adjacent to the first layer, the second layer comprising a glass reinforced epoxy material; and
   a third layer comprising an additional portion of the circuit traces, wherein the second layer further comprises communication vias configured to interconnect portions of the first layer and the third layer.

4. The module of claim 1, wherein at least a portion of the circuits of the first PCB are directly connected to at least a portion of the circuits of the second PCB at a junction between the first PCB and the second PCB.

5. The module of claim 1, wherein the at least one communication interface comprises a ball-grid array configured to establish communication between components associated with the first and second PCBs and the circuit board.

6. A cuboid module configured to mount electronic components to a circuit board, the module comprising:
a core defining a channel therein,
one or more lateral walls surrounding the core, each of the one or more lateral walls being configured to mount at a non-zero angle with respect to the circuit board, wherein each of the one or more lateral walls includes a printed circuit board (PCB) having circuit traces, and edge connectors configured to electrically couple at least one of the circuit traces to a corresponding electrical trace disposed on the circuit board;
a top wall adjacent to the one or more lateral walls, wherein the top wall includes a PCB and an aperture therethrough; and
a metal insert disposed within the channel and aligned with the aperture, wherein the metal inert includes threads for retaining a threaded end of a fastener when the fastener is received through the aperture.

7. The cuboid module of claim 6, further comprising:
a bottom wall adjacent to the one or more lateral walls and substantially parallel to the top wall, the bottom wall comprising at least one communication interface configured to interconnect at least some of the circuit traces with at least some of the corresponding electrical traces on the circuit board, wherein the bottom wall is configured to be mechanically coupled to the circuit board.

8. The cuboid module of claim 7, wherein when the fastener extends through the aperture and secures the cuboid module to a mounting member, the module is operative as a standoff between the PCB and the mounting member.

9. The cuboid module of claim 8, wherein when the fastener is a conductive fastener, the cuboid module is configured to position the conductive fastener within the aperture such that the fastener provides an electrically conductive pathway through which at least one of the circuit traces of the module is electrically coupled with the mounting member.

10. The cuboid module of claim 7, wherein at least one of the one or more the lateral walls further comprises a plurality of layers arranged in a stack formation, the plurality of layers comprising at least:
a first layer comprising at least a portion of the circuit traces;
a second layer arranged adjacent to the first layer, the second layer comprising a supportive material; and
a third layer comprising an additional portion of the circuit traces, and wherein the second layer further comprises a plurality of communication vias configured to interconnect portions of the first layer and the third layer.

11. The cuboid module of claim 7, wherein the at least one communication interface comprises a ball-grid array configured to establish communication between components associated with the one or more lateral walls and the circuit board.

12. The cuboid module of claim 7, wherein the aperture is a first aperture, and wherein the bottom wall further comprises a second aperture in registration with the first aperture of the top wall, the second aperture arranged to receive and support the fastener.

13. The cuboid module of claim 12, wherein the first and second apertures are disposed to allow a direct mechanical coupling between the fastener and the circuit board.

14. A three dimensional module configured to increase useable space on a circuit board, the module comprising:
a central core formed from a solid material;
one or more side surfaces arranged about and surrounding the central core, each of the one or more side surfaces comprising a printed circuit board (PCB) having circuit traces embedded therein and configured to interconnect electronic components arranged thereon;
a base surface connected to the one or more side surfaces and configured to mount the three dimensional module to the circuit board, the base surface comprising at least one communication interface configured to interconnect the circuit traces to associated circuit paths on the circuit board;
a threaded securing feature located within the central core and configured to secure a threaded end of a fastener within the central core; and
an upper surface opposite the base surface and connected to the one or more side surfaces, the upper surface comprising a PCB and defining an aperture permitting access to the threaded securing feature.

15. The module of claim 14, wherein the one or more side surfaces are arranged substantially orthogonal to the base surface.

16. The module of claim 14, wherein the central core comprises a glass-reinforced epoxy material, and wherein each surface of the one or more side surfaces comprises layers wherein at least one of the layers comprises the glass-reinforced epoxy material.

* * * * *